US010136539B2

(12) United States Patent
Kawamura (10) Patent No.: US 10,136,539 B2
(45) Date of Patent: Nov. 20, 2018

(54) ELECTRONIC COMPONENT ASSEMBLY STRUCTURE AND ELECTRONIC COMPONENT

(71) Applicant: Yazaki Corporation, Minato-ku, Tokyo (JP)

(72) Inventor: Yukihiro Kawamura, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 13 days.

(21) Appl. No.: 14/848,414

(22) Filed: Sep. 9, 2015

(65) Prior Publication Data

US 2015/0382497 A1    Dec. 31, 2015

Related U.S. Application Data

(63) Continuation of application No. PCT/JP2014/056709, filed on Mar. 13, 2014.

(30) Foreign Application Priority Data

Mar. 15, 2013  (JP) ................................ 2013-053322

(51) Int. Cl.
*H05K 7/14* (2006.01)
*B60R 16/023* (2006.01)
(Continued)

(52) U.S. Cl.
CPC ........... *H05K 7/14* (2013.01); *B60R 16/0238* (2013.01); *H01R 13/4362* (2013.01);
(Continued)

(58) Field of Classification Search
CPC .......... H01H 50/048; H01H 2050/049; H01H 45/14; H01H 50/14; H01H 50/04;
(Continued)

(56) References Cited

U.S. PATENT DOCUMENTS 4,883,428 A * 11/1989 Tonooka ............. H05K 7/1092
361/736
5,007,844 A *  4/1991 Mason ................... H05K 3/301
439/68
(Continued)

FOREIGN PATENT DOCUMENTS

JP   63-146939 U    9/1988
JP   2010-221787 A  10/2010
JP   2012-243720 A  12/2012

OTHER PUBLICATIONS

International Search Report for PCT/JP2014/056709 dated Jun. 10, 2014.
(Continued)

*Primary Examiner* — Dimary Lopez Cruz
*Assistant Examiner* — Abhishek Rathod
(74) *Attorney, Agent, or Firm* — Sughrue Mion, PLLC (57) ABSTRACT

An electronic component having plural lead terminals protruding from side surfaces of a component main body is inserted and accommodated in a housing member, and the lead terminals are brought into contact with plural terminal fittings held in the housing member to assemble the electronic component into the housing member. Each of the lead terminals includes a base end protruding from at least one side surface of the component main body and a contact portion connected to the base end to droop along the side surface. The component main body is provided with an insulating member which is located to contact or face the base ends from a side of an end surface of the component main body which is most distant from a bottom wall of the housing member in assembling the electronic component into the housing member. Accordingly, it is possible to suppress deformation of the lead terminals.

15 Claims, 10 Drawing Sheets

(51) Int. Cl.
  *H01R 13/436* (2006.01)
  *H05K 5/02* (2006.01)
  *H01H 50/04* (2006.01)
  *H01R 13/514* (2006.01)

(52) U.S. Cl.
  CPC ......... *H05K 5/0217* (2013.01); *H05K 5/0247* (2013.01); *B60R 16/0239* (2013.01); *H01H 50/04* (2013.01); *H01R 13/514* (2013.01)

(58) Field of Classification Search
  CPC ...... H01R 9/24; H01R 13/518; H01R 13/113; H01R 13/4362; H01R 13/514; H02G 3/18; H05K 5/0247; H05K 5/0217; H05K 7/14; B60R 16/0238; B60R 16/0239
  See application file for complete search history.

(56) References Cited

U.S. PATENT DOCUMENTS 5,288,236 A * 2/1994 McIntyre ........... H05K 13/0486
   439/330
2013/0043971 A1  2/2013 Chen et al.

OTHER PUBLICATIONS

Communication dated Mar. 29, 2016, from the Japanese Patent Office in counterpart application No. 2015-505557.
Chinese Office Action dated Nov. 30, 2016, from the Chinese Patent Office in counterpart application No. 201480015345.2.

* cited by examiner

ELECTRONIC COMPONENT ASSEMBLY STRUCTURE AND ELECTRONIC COMPONENT

CROSS-REFERENCE TO RELATED APPLICATION

This application is a continuation application of International Application PCT/JP2014/056709, filed on Mar. 13, 2014, and designating the U.S., the entire contents of which are incorporated herein by reference.

BACKGROUND OF THE INVENTION

1. Field of the Invention

The present invention relates to an electronic component assembly structure and an electronic component, and more particularly, to an electronic component assembly structure provided to an electrical junction box which is mounted on a moving object such as an automobile.

2. Description of the Related Art

In general, a moving object such as an automobile is equipped with an electrical junction box in which an electronic component such as a relay is accommodated to control connection between a power supply device and an electric component (see Japanese Patent Application Laid-open No. 2010-221787).

Figure 9:
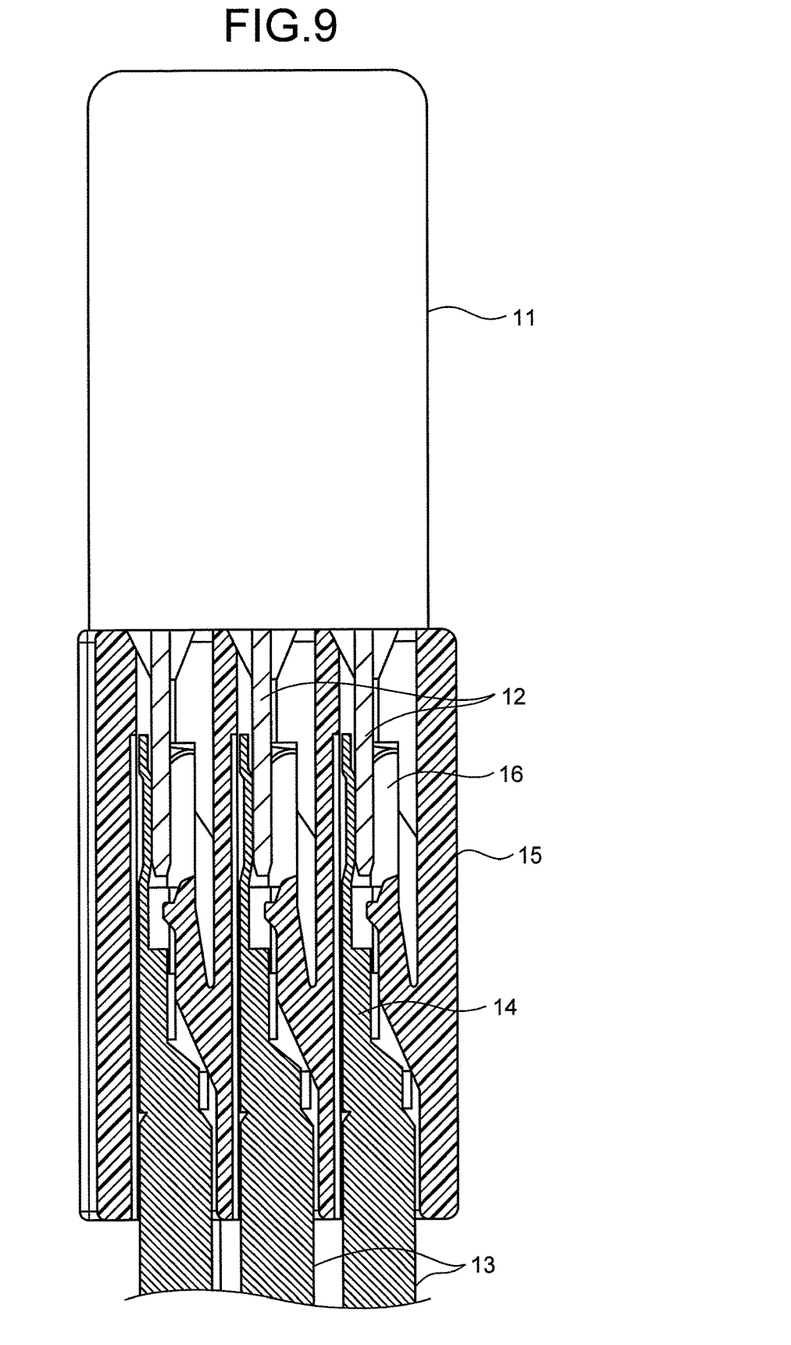
FIG. 9 is a longitudinal-sectional view of a conventional relay module.

FIG. 9 is a longitudinal-sectional view of a conventional relay module. As illustrated in FIG. 9, a conventional relay includes a relay main body 11 formed in a rectangular parallelepiped shape and plural plate-like lead terminals 12 protruding in a straight line shape from one surface (bottom surface) of the relay main body 11. Such a type of relay is assembled into a resinous holding member 15, which holds terminal fittings 14 connected to electrical wires 13, to constitute a relay module. The relay module is assembled into an electrical junction box. Each terminal fitting 14 is provided with a spring portion 16 to which the lead terminal 12 is fitted. The relay is held by the holding member 15 by inserting tips of the plural lead terminals 12 into the spring portions 16. In FIG. 9, the conventional relay module is basically illustrated in a longitudinal-sectional view but only the relay main body 11 is illustrated in a side view.

However, since such a type of relay module is assembled in a state in which the relay main body 11 is placed on an end surface (top surface) of the holding member 15, for example, the height dimension (in the up-down direction in FIG. 9) of the relay module increases.

Figure 10:
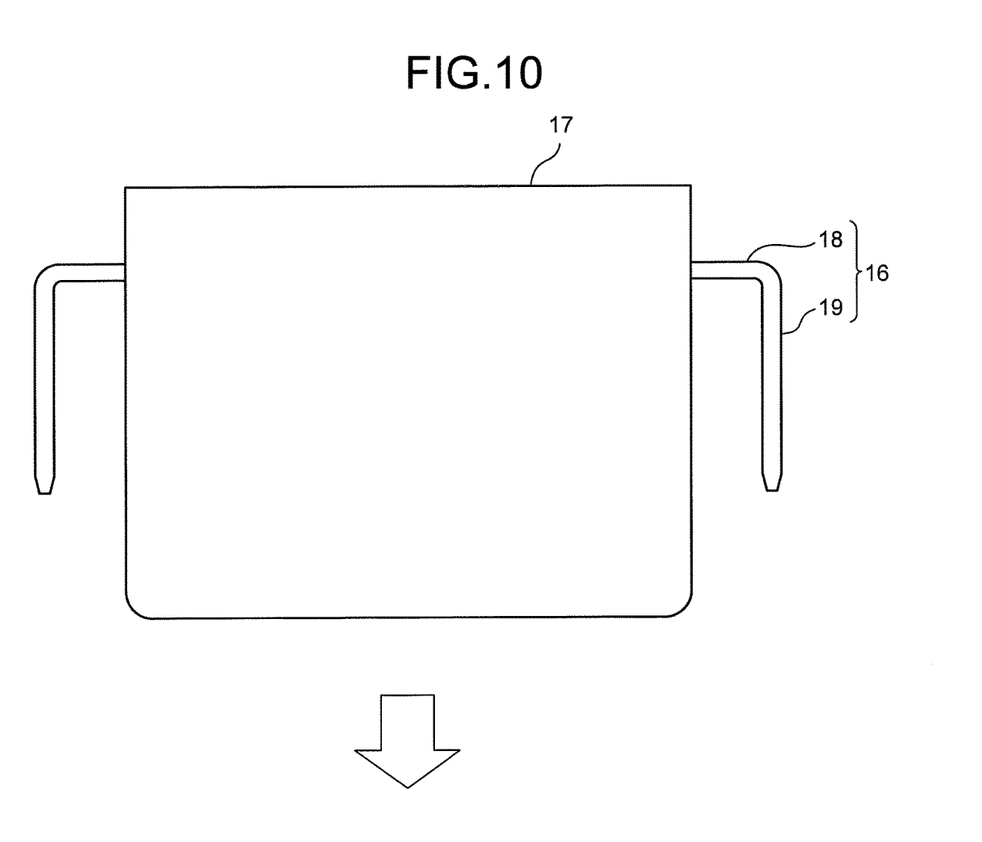
FIG. 10 is a side view illustrating an example of the relay.

Therefore, for example, as illustrated in FIG. 10, it can be considered that each lead terminal 16 of a relay is bent and formed in an L shape. FIG. 10 is a side view illustrating an example of a relay. Each lead terminal 16 includes a base end 18 protruding from a side surface of a relay main body 17 having a rectangular parallelepiped shape and a contact portion 19 drooping along the side surface of the relay main body 17 from which the base end 18 protrudes. According to this configuration, since the relay main body 17 can be accommodated in an opened box-like housing member (not illustrated) by inserting the relay into the housing member and fitting the lead terminals 16 (contact portions 19) to the terminal fittings held in the housing member, it is possible to reduce the height dimension of the relay module.

However, the relay illustrated in FIG. 10 is held in the housing member by fitting the tips of the lead terminals 16 (the contact portions 19) to the terminal fittings and pressing the tips with the spring portions. Accordingly, in accommodating the relay in the housing member, the lead terminals 16 are inserted into the spring portions against the spring force of the terminal fittings. Accordingly, in each lead terminal 16 having an L shape, a load (reaction force) in inserting the lead terminal into the terminal fitting is concentrated on a bent portion or the like and thus the lead terminal 16 may be deformed to the direction (to the upper side in FIG. 10) opposite to the fitting direction. Here, the deformation of the lead terminal should be within an elastic limit range, but when the degree of deformation increases, the lead terminal 16 may be permanently deformed and, for example, a connection state to the terminal fitting or a holding force of the relay may be affected.

SUMMARY OF THE INVENTION

The present invention is made in consideration of the above-mentioned problems and an object thereof is to suppress deformation of a lead terminal.

In order to solve the above-mentioned problems, an electronic component assembly structure according to one aspect of the present invention includes an electronic component including a component main body having a rectangular parallelepiped shape, and a plurality of lead terminals protruding from side surfaces of the component main body; a housing member in which the electronic component is inserted and accommodated; and a plurality of terminal fittings which are held in the housing member and to which the lead terminals are fitted. Here, each of the lead terminals includes a base end protruding from at least one side surface of the component main body, and a contact portion connected to the base end to droop along the side surface. The component main body is provided with an insulating member which is located to contact or face the base ends from a side of an end surface of the component main body which is most distant from a bottom wall of the housing member when assembling the electronic component into the housing member. The electronic component is inserted and accommodated in the housing member, the plurality of lead terminals come in contact with the plurality of terminal fittings, respectively, and the electronic component is assembled into the housing member.

In this case, the insulating member is formed in a substantially rectangular plate shape in a plan view and is disposed along the end surface of the component main body.

Further, the insulating member partially or entirely covers the base ends in the protruding direction.

Further, the insulating member is a part which seals accommodated elements included in the component main body.

Further, in order to solve the above-mentioned problems, an electronic component according to the present invention includes a component main body having a rectangular parallelepiped shape; and a plurality of lead terminals protruding from the component main body. Here, each of the lead terminals includes a base end protruding from at least one side surface of the component main body, and a contact portion connected to the base end to droop along the side surface. The component main body is provided with an insulating member which is located to contact or face the base ends from a side of an end surface of the component main body which is most distant from a bottom wall of the housing member when assembling the component main body into the housing member.

In this case, the insulating member is formed in a substantially rectangular plate shape in a plan view and comes in contact with the base end and is disposed along the end surface of the component main body.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an electronic component assembly structure according to the present invention will be described with reference to the accompanying drawings. In this embodiment, a relay module in which a relay is used as an electronic component and the relay is accommodated in a housing member will be described, but the electronic component assembly structure according to the present invention can be applied to electronic components other than the relay.

The usage of the relay module according to this embodiment is not particularly limited, but a case can be considered in which the relay module is used for equipment or the like for controlling a connection state between a power supply device and an electric component in a moving object such as an automobile. Specifically, for example, it can be considered that the relay module is introduced into an electrical junction box (junction box) disposed between an electric component and a battery which are mounted on an automobile and is used as a relay module for controlling input and cutoff of power. Such a type of relay module may be integrally formed with the electrical junction box, but may be formed as an independent body.

Figure 1:
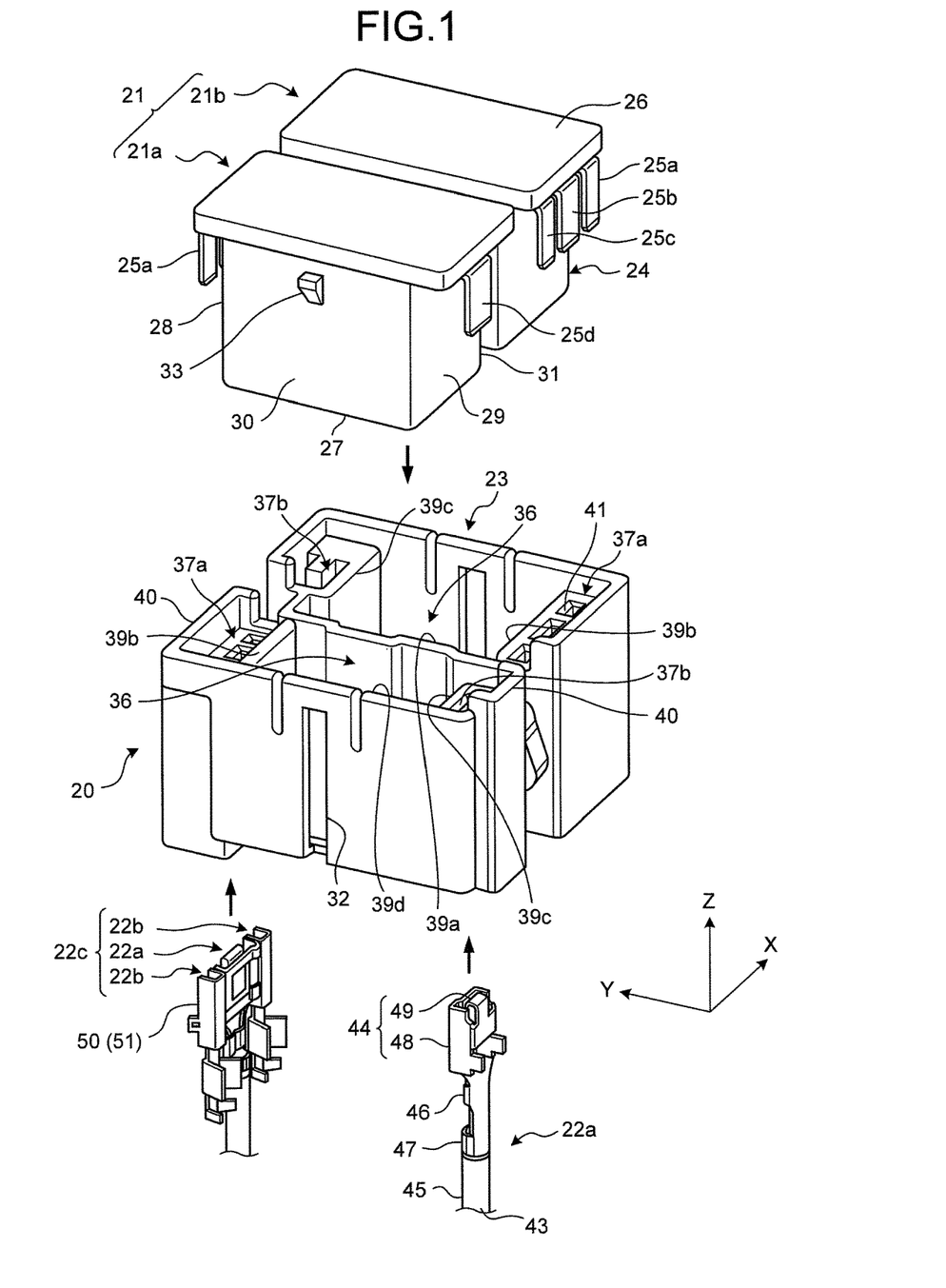
FIG. 1 is an assembly diagram of a relay module according to the present invention.
Figure 2:
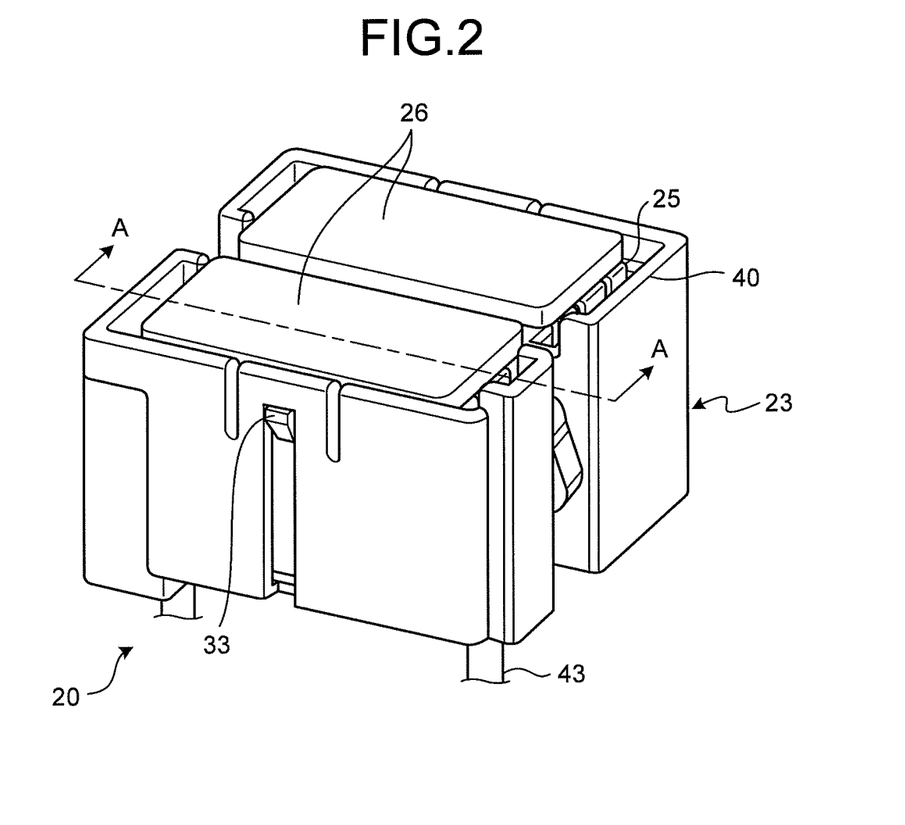
FIG. 2 is a diagram illustrating the entire configuration of the relay module according to the present invention.
Figure 3:
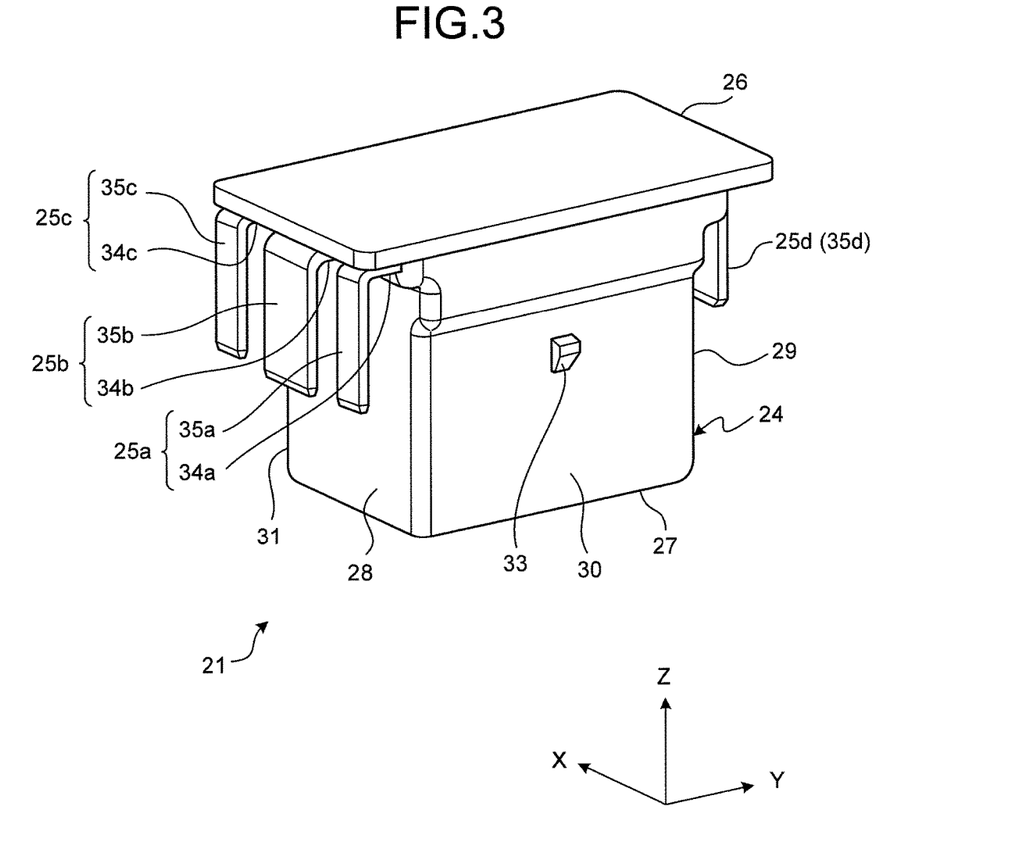
FIG. 3 is a perspective view illustrating an appearance of a relay illustrated in FIG. 1.
Figure 4:
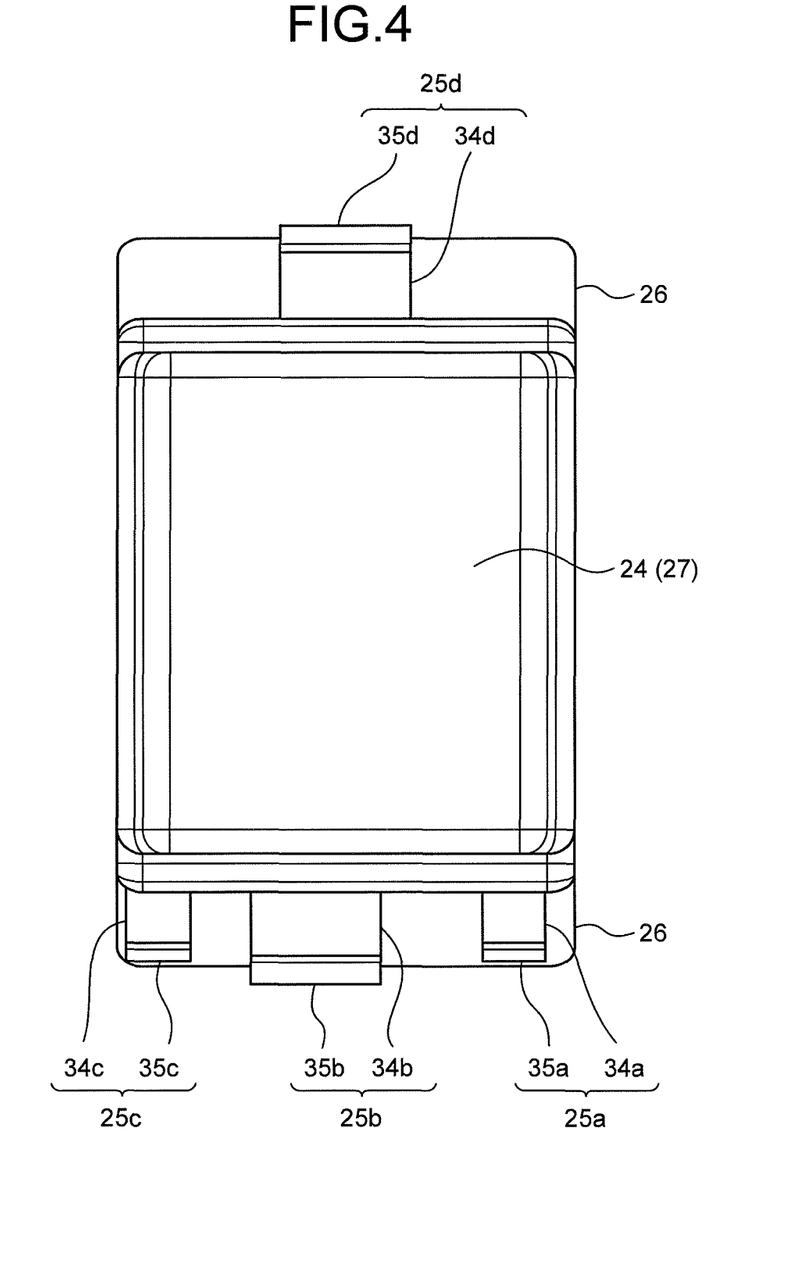
FIG. 4 is a plan view of the relay illustrated in FIG. 3 when viewed from the bottom side.
Figure 5:
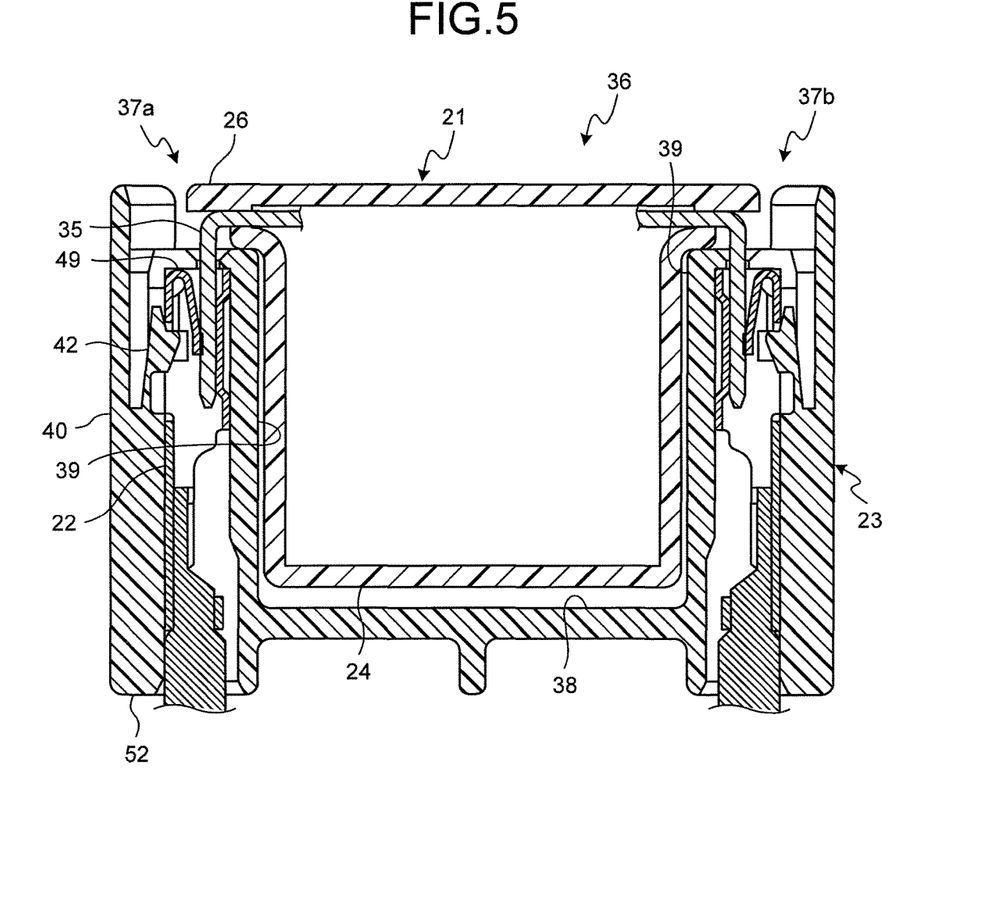
FIG. 5 is a cross-sectional view taken along arrow A-A of FIG. 2.
Figure 6:
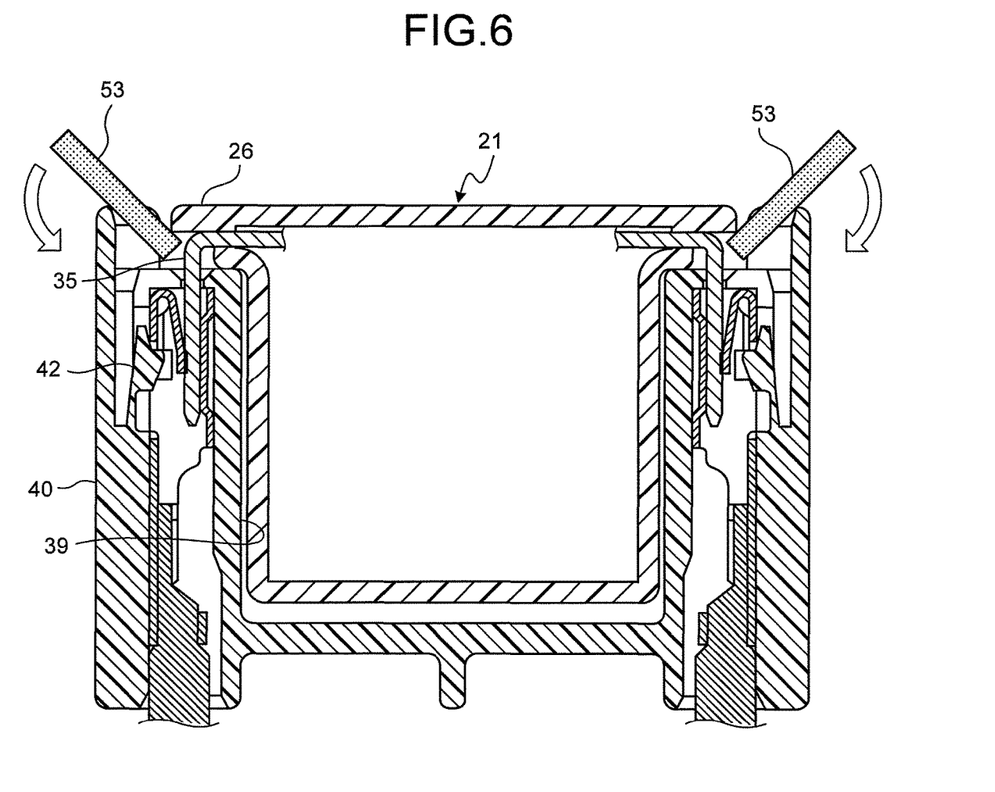
FIG. 6 is a diagram illustrating a method of detaching the relay in FIG. 5.

FIG. 1 is an assembly diagram of a relay module 20 according to an embodiment. FIG. 2 is a diagram illustrating the entire configuration of the relay module 20 illustrated in FIG. 1. FIG. 3 is a perspective view illustrating the entire configuration of a relay illustrated in FIG. 1. FIG. 4 is a plan view of the relay when viewed from the bottom side. FIG. 5 is a cross-sectional view taken along arrow A-A of FIG. 2. In the following description, a direction indicated by arrow X in FIG. 1 is defined as a front-back direction, a direction indicated by arrow Y is defined as a right-left direction, and a direction indicated by arrow Z is defined as an up-down direction (hereinafter, the same applies to FIG. 2). However, the up-down direction, the right-left direction, and the front-back direction may not necessarily match the respective directions in a state in which the relay module 20 is actually mounted on a moving object. In FIGS. 5 and 6, various components accommodated in a relay main body 24 are not illustrated.

As illustrated in FIG. 1, the relay module 20 according to this embodiment has a configuration in which a relay 21, terminal fittings 22, and a housing member 23 are mutually assembled. In this embodiment, it is assumed that one relay module 20 includes two relays 21a and 21b. However, the number of relays constituting one relay module is not limited to two and the relay module may include only one relay or may include three or more relays. When the relay module includes plural relays, relays 21 having the configuration illustrated in FIG. 1 may be employed or relays having configurations (for example, FIGS. 7 and 8) other than the configuration illustrated in FIG. 1 may be mixed as described later.

Each relay 21 includes the relay main body 24 which is a component main body having a rectangular parallelepiped shape and which is formed of a resin or the like, four plate-like lead terminals 25a to 25d which protrude from the relay main body 24, and a plate-like insulating member 26 which is attached to the relay main body 24. The relay main body 24 is a bottomed box-like container in which electronic components are accommodated, and the insulating member 26 is attached along the top surface of an opening edge not illustrated. The relays 21a and 21b have the same configuration but the right and left sides thereof are reversed. The detailed configuration of the insulating member 26 will be described later.

The relay main body 24 has a top surface not illustrated, a bottom surface 27 located below, a left side surface 28 and a right side surface 29 facing each other in the right-left direction, and a front surface 30 and a back surface 31 facing each other in the front-back direction, and the insulating member 26 is attached to the top surface. The relay main body 24 has a substantially rectangular parallelepiped shape which is long in the right-left direction, and four surfaces of the left side surface 28, the right side surface 29, the front surface 30, and the back surface 31 are side surfaces. The front surface 30 is provided with a locking protrusion 33 which engages with a penetration groove 32 formed in the housing member 23. The relay main body 24 according to this embodiment is formed in a rectangular parallelepiped shape, but may be formed in a square parallelepiped shape.

As illustrated in FIG. 3, each of the lead terminals 25a to 25d includes a plate-like base end 34 (34a to 34d) protruding from a side surface of the relay main body 24 and a plate-like contact portion 35 (35a to 35d) connected to and extending from the base end 34. The lead terminals 25a to 25c among lead terminals 25 include the base ends 34a to 34c perpendicularly protruding from the left side surface 28 of the relay main body 24 with a gap therebetween in the width direction (the front-back direction) of the relay main body 24 and contact portions 35a to 35c which are connected to the base ends 34a to 34c to droop along the left side surface 28 with a predetermined gap from the left side surface 28 of the relay main body 24. On the other hand, the lead terminal 25d includes the base end 34d (FIG. 4) perpendicularly protruding from the right side surface 29 of the relay main body 24 and the contact portions 35d which is connected to the base end 34d to droop along the right side surface 29 with a predetermined gap from the right side surface 29 of the relay main body 24.

The base ends 34a to 34d protrude in parallel to the top surface or the bottom surface 27, and the protruding position is set to the same height position below the top surface. On the other hand, the contact portions 35a to 35d extend in parallel with the opposite side surfaces of the relay main body 24 and the distances thereof from the opposite side surfaces are set to the same. In the contact portions 35a to 35d, the height positions of the tips (lower ends) thereof are set to the same height position above the bottom surface 27 of the relay main body 24. The widths in the front-back direction of the base ends 34a and 34c and the contact portions 35a and 35c of the lead terminals 25a and 25c are set to the same magnitude, and the widths in the front-back direction of the base ends 34b and 34d and the contact portions 35b and 35d of the lead terminals 25b and 25d are set to the same magnitude. The width in the front-back direction of the base ends 34b and 34d and the contact portions 35b and 35d of the lead terminals 25b and 25d are set to be greater than the width in the front-back direction of the base ends 34a and 34c and the contact portions 35a and 35c of the lead terminals 25a and 25c.

The housing member 23 is a resinous casing for accommodating and holding the relay 21 and the terminal fittings 22 and includes a first housing chamber 36 that guides and accommodates the relay main body 24 therein and a second housing chamber 37 (37a and 37b) that accommodates and holds the terminal fittings 22 therein. In this embodiment, the housing member 23 is treated as a single member independent of an electrical junction box not illustrated. However, the housing member 23 may be formed as a part of a casing which is formed in the electrical junction box and may be formed as a unified body with the electrical junction box.

As illustrated in FIG. 1, two first housing chambers 36 are formed in the housing member 23 according to this embodiment, and two second housing chambers 37a and 37b are arranged with each first housing chamber 36 interposed therebetween. The lead terminals 25a to 25c are accommodated in the second housing chamber 37a, the lead terminal 25d is accommodated in the second housing chamber 37b, and the terminal fittings 22 are held at predetermined positions to correspond to the lead terminals 25 inserted into the second housing chambers 37.

As illustrated in FIG. 5, the first housing chamber 36 is surrounded with a bottom wall 38 and wall portions 39 rising upright from the bottom wall 38 to form a concave space of which the top is opened to the outside. The wall portions 39 rise upright from the bottom wall 38 so as to surround the side surfaces (the left side surface 28, the right side surface 29, the front surface 30, and the back surface 31) of the relay main body 24 from four directions and guide and accommodate the relay main body 24 in the first housing chamber 36. The first housing chamber 36 is formed in a rectangular parallelepiped shape which is slightly larger than the relay main body 24, smoothly accommodates the relay main body 24 guided by the wall portions 39 therein, and holds the posture of the relay main body 24 by causing four side surfaces of the accommodated relay main body 24 to interfere with the wall portions 39.

As illustrated in FIG. 1, the penetration groove 32 directing the first housing chamber 36 to the outside of the housing member 23 is formed in a wall portion 39d (the wall portion facing the front surface 30 of the relay main body 24) other than a wall portion 39a partitioning the neighboring first housing chambers 36 and wall portions 39b and 39c as partition walls from the second housing chambers 37 among the four wall portions 39 (39a to 39d) forming the first housing chamber 36 so as to extend in the height direction of the wall portions 39. The penetration groove 32 is configured to lock the locking protrusion 33 of the relay main body 24 when the relay main body 24 is accommodated in the first housing chamber 36.

The second housing chambers 37a and 37b are disposed outside the wall portions 39b and 39c of the first housing chamber 36, that is, on the opposite sides of the first housing chamber 36 with the wall portions 39b and 39c interposed therebetween, and are surrounded with a rectangular tubular frame formed by the wall portions 39b and 39c and a frame portion 40 of the housing member 23 to form a rectangular parallelepiped space of which the top portion and the bottom portion are opened to the outside. In the second housing chamber 37a disposed outside the wall portion 39b of the first housing chamber 36, at least the vicinity of an opening into which the lead terminals 25 are inserted is partitioned by a partition wall 41 formed by the wall portion 39b and the frame portion 40. The second housing chambers 37a and 37b are provided with lances 42 (locking pieces) at positions facing the terminal fittings 22 as illustrated in FIG. 5. Each lance 42 serves to hold the corresponding terminal fitting 22 in the second housing chamber 37, is integrally molded to extend in a cantilever shape from the frame portion 40 to the second housing chamber 37 so as to be elastically deformed.

The terminal fitting 22 is an interface member that is connected to a terminal portion of an electrical wire 43 so as to electrically connect the electrical wire 43 to the relay 21. As illustrated in FIG. 1, each terminal fitting 22 includes a first terminal fitting 22a and a second terminal fitting 22b. The terminal fittings 22a and 22b are formed by machining a conductive metal sheet.

The first terminal fitting 22a has the contact portions 35b and 35d fitted thereto and includes a female fitting portion 44 which supports the contact portion 35, a pair of core clamping pieces 46 which caulk a core wire exposed by peeling an insulating coating 45 of the terminal portion of the electrical wire 43, and a pair of external clamping pieces 47 which caulk a tip of the insulating coating 45 of the electrical wire 43. The fitting portion 44 includes a tubular portion 48 having a rectangular tubular shape and having a space into which the contact portions 35b and 35d are inserted and a spring portion 49 which is formed by folding a plate-like member connected to a side plate forming the tubular portion 48 from the vicinity of the insertion hole of the tubular portion 48 to the space. The contact portions 35b and 35d are supported by the fitting portion 44 by pressing the contact portions 35b and 35d inserted into the space of the tubular portion 48 against another side plate facing the side plate with an elastic force of the spring portion 49.

The second terminal fitting 22b serves to have the contact portions 35a and 35c fitted thereto and the structure for supporting the contact portions 35 is basically the same as the first terminal fitting 22a. Accordingly, a fitting portion 50 corresponding to the fitting portion 44 of the first terminal fitting 22a will be described below. The fitting portion 50 includes a tubular portion 51 having a space into which the contact portions 35a and 35c are inserted and a spring portion (not illustrated) disposed in the tubular portion 51. The tubular portion 51 is formed to have a width smaller than that of the fitting portion 44 of the first terminal fitting 22a. That is, the fitting portion 50 supports the contact portions 35a and 35c by pressing the contact portions 35a and 35c inserted into the tubular portion 51 in a predetermined direction using the spring portion. Both the terminal fittings 22a and 22b have a well-known terminal structure, and are not particularly limited as long as they can support the contact portion 35. For example, a terminal fitting called a fastening type may be employed.

In this embodiment, as illustrated in FIG. 1, the second terminal fittings 22b are accommodated on both sides of the first terminal fitting 22a in the second housing chamber 37a. The first terminal fitting 22a is accommodated in the second housing chamber 37b. The terminal fittings 22a and 22b are supported by the lances 42 in the second housing chamber 37.

Each lance 42 forms a so-called spring mechanism, serves to press the lower edge of the spring portion 49 of the terminal fitting 22 with a restoration force from elastic deformation and to lock the lower edge, achieves fixation of the terminal fitting 22 to the second housing chamber 37, and holds the terminal fitting 22 in the second housing chamber 37. In this embodiment, the right and left lances 42 are arranged to be symmetric as illustrated in FIG. 5, but the right and left lances 42 may be disposed to extend in the same direction, for example, one lance 42 may extend from the frame portion 40 and the other lance 42 may extend from the wall portion 39.

For example, in order to accommodate the first terminal fitting 22a in the second housing chamber 37b and to hold the first terminal fitting using the lances 42, the first terminal fitting 22a is inserted from an opening 52 (FIG. 5) on the bottom of the second housing chamber 37b. Then, the first terminal fitting 22a is inserted into the second housing chamber 37b until the tip (fitting portion 44) thereof comes in contact with the lance 42. When an upward force (insertion force) is applied to the first terminal fitting 22a so as to further insert the first terminal fitting 22a into the second housing chamber 37b in this state, the lance 42 is pressed by the first terminal fitting 22a and is elastically deformed to approach the frame portion 40. When an insertion force is applied to the first terminal fitting 22a against the restoration force from elastic deformation, the first terminal fitting 22a moves upward in a state in which the lance 42 comes in sliding contact with the fitting portion 44. When the first terminal fitting 22a moves and the lance 42 relatively reaches the lower edge of the spring portion 49 along the fitting portion 44, the lance 42 is elastically deformed and engages with the lower edge of the spring portion 49. By causing the lance 42 to engage with the first terminal fitting 22a in this way, the first terminal fitting 22a is locked to the lance 42. Accordingly, it is possible to prevent the first terminal fitting 22a from getting out of the second housing chamber 37b. That is, the first terminal fitting 22a is held in the second housing chamber 37b.

On the other hand, in this embodiment, the position in the up-down direction of the relay 21 in a state in which the relay 21 is accommodated in the housing member 23, that is, when the contact portions 35 of the lead terminals 25 are fitted to the spring portions 49 of the terminal fittings 22 (the first terminal fittings 22a), is set to a predetermined height position such that the insulating member 26 does not protrude from the top of the housing member 23 as illustrated in FIG. 2. Here, the height position of the insulating member 26 can be determined depending on the positions at which the contact portions 35 of the lead terminals 25 are fitted to the spring portions 49 of the terminal fittings 22. That is, in the second housing chamber 37, each terminal fitting 22 is held at the height position at which the spring portion 49 holding the contact portion 35 of the lead terminal 25 faces the side surface of the relay main body 24 accommodated in the first housing chamber 36 with the wall portion 39 interposed therebetween. The top end face of the wall portion 39 is disposed at a predetermined height position below the top end surface of the housing member 23 so as not to contact with the base end 34 of the lead terminal 25 when the contact portion 35 of the lead terminal 25 is fitted to the spring portion 49 of the terminal fitting 22, and the bottom wall 38 is disposed at a predetermined height position not coming in contact with the bottom surface 27 of the relay main body 24. Accordingly, except for the portions in which the contact portions 35 of the lead terminals 25 are fitted to the spring portions 49 of the terminal fittings 22, the relay 21 is held in the housing member 23 without interfering with the bottom wall 38 or the top end face of the wall portion 39 in the height direction of the housing member 23. Accordingly, it is possible to satisfactorily bring the lead terminals 25 into contact with the terminal fittings 22 and thus to stabilize a holding force of the relay 21 in the housing member 23. In FIG. 5, the top end face of the wall portion 39 comes in contact with a portion of the relay main body 24 having a level difference. In this case, it is also possible to stably hold the relay 21.

When the relay 21 is assembled into the housing member 23 in this embodiment, the relay main body 24 is brought into contact with the wall portion 39 of the first housing chamber 36 to stabilize the posture thereof such that the relay 21 is not excessively inclined with respect to the first housing chamber 36, the relay main body 24 is guided along the wall portion 39, and is inserted into the first housing chamber 36. When the vicinity of the lower end of the relay main body 24 is accommodated in the first housing chamber 36, the tips (lower ends) of the contact portions 35 of the lead terminals 25 are positioned to face the fitting portions 44 above the terminal fittings 22. When the relay main body 24 is inserted to the vicinity of the bottom wall 38 of the first housing chamber 36 in a state in which the contact portions 35 are positioned in this way, the contact portions 35 are inserted into the tubular portions 48 of the fitting portions 44 and the contact portions 35 are supported (fitted) with the pressing force of the spring portions 49. In the relay module 20 assembled in this way, as illustrated in FIGS. 2 and 5, the relay 21 is held in the housing member 23 and the relay 21 is electrically connected to the electrical wire 43 via the terminal fittings 22.

As described above, the relay 21 is supported in the housing member 23 with the spring force when the contact portions 35 of the lead terminals 25 are fitted to the fitting portions 44 of the terminal fittings 22. Accordingly, when the relay 21 is accommodated in the housing member 23, the contact portions 35 need to be inserted into the fitting portions 44 against the spring force of the spring portions 49. In this case, in each lead terminal 25 having an L shape as in this embodiment, a load (reaction force) in fitting the lead terminals into the fitting portions 44 is concentrated on a bent portion or the like and thus the lead terminals 25 may be deformed to the direction opposite to the fitting direction, that is, upward in FIG. 1. The deformation should be within an elastic limit range, but when the degree of deformation increases, the lead terminals 25 may be permanently deformed and thus a connection state to the terminal fittings 22 or a holding force of the relay 21 may be affected.

From this point of view, the relay 21 according to this embodiment is characterized in that the relay main body 24 is provided with the insulating member 26. The configuration of the insulating member 26 will be described below. The insulating member 26 is attached along the end surface (the top surface not illustrated) of the relay main body 24.

The insulating member 26 is formed by molding using an insulating resin or the like, is formed in a substantially rectangular plate shape in a plan view as illustrated in FIGS. 3 and 4, protrudes in a direction perpendicular to the side surfaces 28 to 31 of the relay main body 24, is located above the base ends 34 of the lead terminals 25, and is disposed to face the base ends 34. The insulating member 26 in this embodiment comes in contact with the top surfaces of the base ends 34 of the lead terminals 25 and is disposed along the top surface of the base ends 34. As illustrated in FIG. 4, the insulating member 26 extends to the tips of the base ends 34 of the lead terminals 25 or the vicinities of the tips. In other words, the "position above the base ends 34 of the lead terminals 25" at which the insulating member 26 is disposed can be typically said to be a position on the side of the end surface of the relay main body 24 which is most distant from the bottom wall 38 of the housing member 23 (the first housing chamber 36) in assembling the relay 21 into the housing member 23 as illustrated in FIG. 5 and the like.

According to this configuration, the base ends 34 of the lead terminals 25 can be supported from the upper side using the insulating member 26. Accordingly, since a stress (reaction force) acting on the lead terminals 25 in inserting the lead terminals 25 into the terminal fittings 22 can be applied to the insulating member 26, it is possible to prevent deformation of the lead terminals 25. As a result, since the connection state between the lead terminals 25 and the terminal fittings 22 can be maintained good, it is possible to maintain the electrical connection state between the lead terminals 25 and the terminal fittings 22 good and to prevent a decrease in the holding force of the relay 21 in the housing member 23.

In this embodiment, the insulating member 26 is disposed to come in contact with the base ends 34 of the lead terminals 25, but may be disposed to be separated from the top end surfaces of the base ends 34. In this case, the distance by which the insulating member 26 is separated from the top end surfaces of the base ends 34 is limited to a range in which the deformation of the lead terminals 25 can be elastically restored when the lead terminals 25 are inserted into the terminal fittings 22.

FIG. 6 is a diagram illustrating a method of detaching the relay in FIG. 5. As illustrated in FIG. 5, the size in the in-plane direction of the insulating member 26 in this embodiment is set so as to form a gap from the inner circumferential surface of the frame portion 40 of the housing member 23 in a state in which the relay 21 is accommodated in the housing member 23. Accordingly, in detaching the relay 21 from the housing member 23, as illustrated in FIG. 6, the relay 21 can be simply detached, for example, by hooking tips of plural rod-like tools 53 to positions of the insulating member 26 not interfering with the lead terminals 25 but protruding from the side surfaces of the relay main body 24 and causing the tools 53 to fall in the arrow direction about the top end of the frame portion 40.

Since the insulating member 26 in this embodiment is formed to come in contact with the top surface of the base ends 34 of the lead terminals 25, the top surfaces of the base ends 34 are covered with the insulating member 26, but other surfaces such as front and rear side surfaces of the base ends 34 are exposed. Accordingly, the insulating member 26 may be formed to partially or entirely cover the base ends 34 in the longitudinal direction (protruding direction). That is, the top and bottom surfaces and the side surfaces of the base ends 34 are covered with the insulating member 26 along the longitudinal direction. The insulating member 26 can be formed, for example, by insert-molding the lead terminals 25. According to this configuration, it is possible to prevent an electric shock due to contact of a finger with the lead terminals 25. It is also possible to prevent a short circuit between the lead terminals 25 due to contact of a conductor such as a tool with the neighboring lead terminals 25.

The insulating member 26 in this embodiment is a part sealing the relay main body 24 which is formed in a box shape and in which electronic components are accommodated. That is, the insulating member 26 is attached to the end face (top surface) of an edge of an opening of the relay main body 24 and serves as a lid sealing the inside of the relay main body 24. In this way, when a part of a member sealing the relay main body 24 is used as the insulating member 26, it is not necessary to form a new member as the insulating member. Accordingly, it is possible to prevent an increase in the number of components of the relay 21 and to prevent an increase in thickness of the relay 21 due to attachment of a new member to the relay main body 24 or an increase in size of the relay module due thereto.

An electronic component having a shape different from the relay 21 illustrated in FIG. 1 will be described below. In the above-mentioned embodiment, the relay module 20 into which the relay 21 illustrated in FIG. 1 is assembled is described as an example of the electronic component assembly structure according to the present invention, but the configuration of the electronic component is not limited to this example. For example, as long as an electronic component includes a component main body having a rectangular parallelepiped shape (which includes a square parallelepiped shape) and lead terminals protruding from side surfaces of the component main body, each lead terminal includes a base end protruding from at least one side surface of the component main body and a contact portion connected to the base end to droop along the side surface with a gap from the side surface of the component main body, and the component main body is provided with an insulating member located to face the base end above the base end, the same advantages as the relay 21 illustrated in FIG. 1 can be achieved, for example, from electronic components (for example, relays) having the following shapes. In the following description, differences from the relay 21 illustrated in FIG. 1 will be mainly mentioned.

Figure 7:
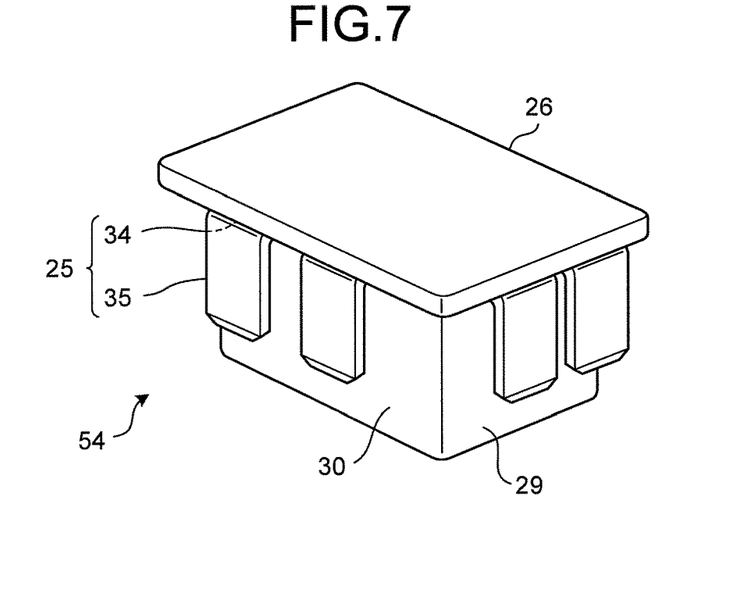
FIG. 7 is a perspective view illustrating a relay according to another embodiment of the present invention.

FIG. 7 is a perspective view illustrating a relay according to another embodiment of the present invention. In the relay 21 illustrated in FIG. 1, each of a pair of parallel side surfaces of the relay main body 24 is provided with the lead terminals 25, but two neighboring side surfaces 29 and 30 may be provided with the lead terminals 25 like a relay 54 illustrated in FIG. 7. Here, the insulating member 26 is a rectangular plate member which is located to face the base ends 34 of the lead terminals 25 from the upper side, similarly to FIG. 1. In this case, in the housing member 23 accommodating the relay 54, the second housing chamber 37 is formed at two positions adjacent to the first housing chamber 36 to correspond to the arrangement of the lead terminals 25 and the second housing chambers are arranged to be perpendicular to each other. In each second housing chamber 37, the terminal fittings 22 corresponding to the number of lead terminals 25 inserted into the second housing chamber are held to correspond to the lead terminals 25.

In the relay 54 illustrated in FIG. 7, each of two neighboring side surfaces of the relay main body 24 is provided with two lead terminals 25, but the number of lead terminals 25 formed on the side surfaces may be equal to or different from each other. The lengths in the width direction of the lead terminals 25 formed on the side surfaces are particularly limited. The number of side surfaces of the relay main body 24 provided with the lead terminals 25 is not limited to two, but may be one or may be three or more. In this case, the second housing chamber 37 can be formed at one or more positions adjacent to the first housing chamber 36 to correspond to the arrangement of the lead terminals 25.

Figure 8:
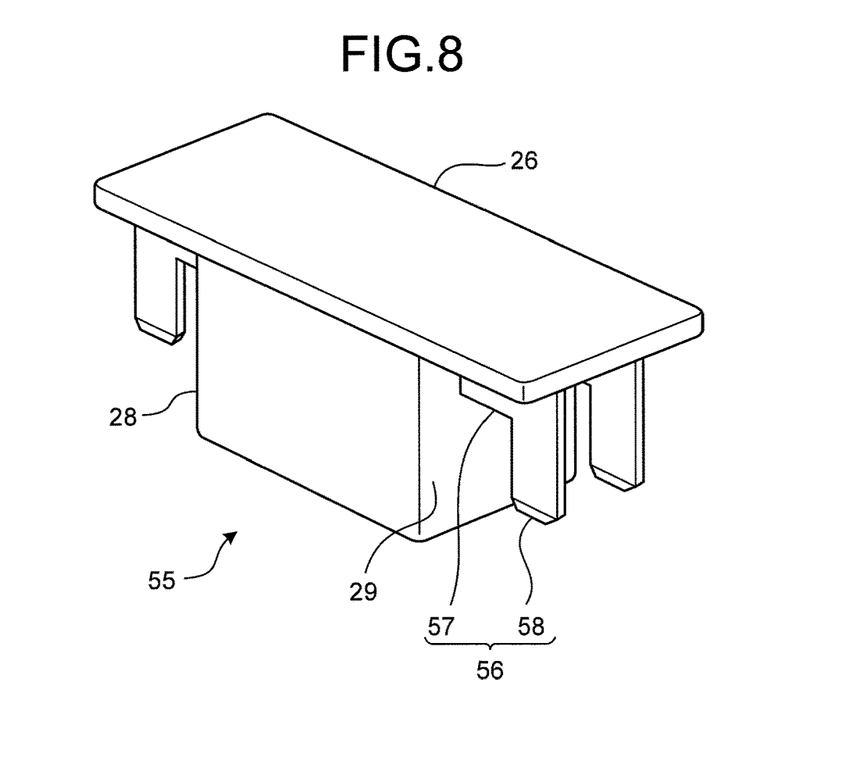
FIG. 8 is a perspective view illustrating a relay according to another embodiment of the present invention.

FIG. 8 is a perspective view illustrating a relay according to another embodiment of the present invention. In the above-mentioned relays, the thickness direction of the contact portions 35 of the lead terminals 25 intersects (is perpendicular to) the side surfaces of the relay main body 24 facing the contact portions 35, but lead terminals 56 may be formed such that the thickness direction thereof is parallel to the side surfaces of the relay main body 24 like a relay 55 illustrated in FIG. 8. In the relay 55 illustrated in FIG. 8, base ends 57 and contact portions 58 of the lead terminals 56 are formed in a plate shape extending to be parallel to the front surface 30 and the back surface 31 of the relay main body 24, the thickness direction of the contact portions 58 of two lead terminals 56 formed on one side surface 28 is parallel to the left side surface 28 of the relay main body 24, and the thickness direction of the contact portions 58 of the two lead terminals 56 formed on the other side surface 29 is parallel to the right side surface 29 of the relay main body 24. As in other relays, each base end 57 protrudes perpendicularly from the corresponding side surface of the relay main body 24 and each contact portion 58 extends in parallel with the corresponding side surface of the relay main body 24 with a gap from the side surface. As in other relays, the insulating member 26 is also formed along the top surfaces of the base ends 57 of the lead terminals 56. In this case, in the housing member 23 accommodating the relay 55, the second housing chamber 37 is formed at two positions adjacent to the first housing chamber 36 to correspond to the arrangement of the lead terminals 56, and the second housing chambers 37 are arranged to be parallel with each other. In each of the second housing chambers 37, the terminal fittings 22 corresponding to the number of lead terminals 56 are arranged in the direction of the lead terminals 56 to correspond to the lead terminals 56 inserted in the second housing chambers.

Figure 11A:
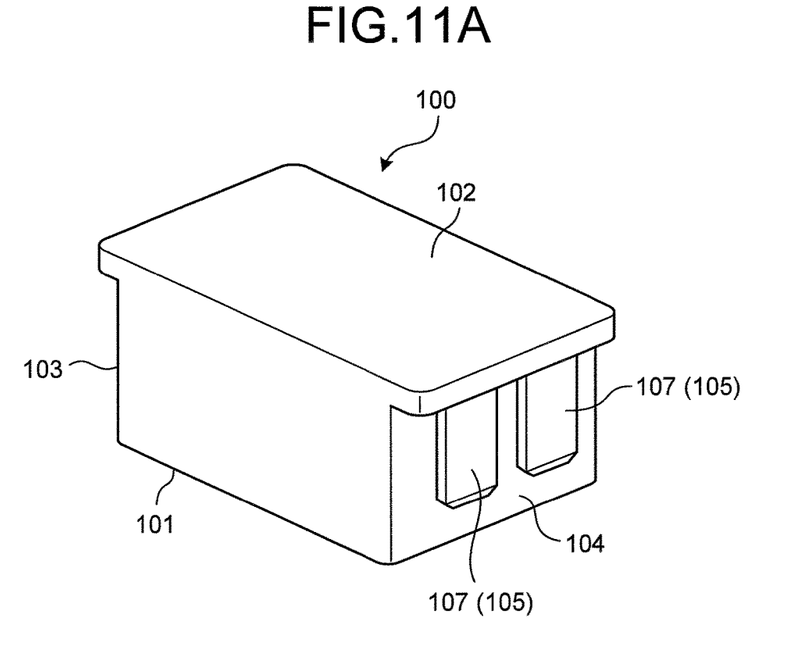
FIG. 11A is a perspective view illustrating an appearance of a relay in which base ends of lead terminals are surrounded with a resin.

In the above-mentioned relays, the base ends of the lead terminals are completely exposed, but at least a part of each base end may be covered with a resin. FIG. 11A is a perspective view illustrating an appearance of a relay in which base ends of lead terminals are covered with a resin and FIG. 11B is a side view of the relay illustrated in FIG. 11A.

Figure 11B:
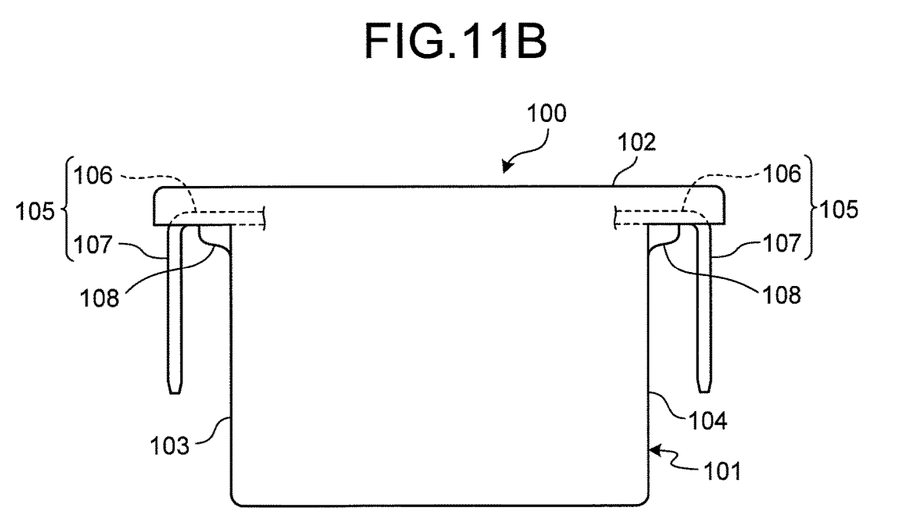
FIG. 11B is a side view of the relay illustrated in FIG. 11A.

As illustrated in FIGS. 11A and 11B, a plate-like insulating member 102 is attached to a relay 100 along one surface (for example, the top surface not illustrated) of a relay main body 101, like the relay 21 according to the above-mentioned embodiment. The insulating member 102 is formed in a substantially rectangular shape in a plan view by molding an insulating resin or the like. The insulating member 102 extends in a direction perpendicular to a pair of side surfaces 103 and 104 of the relay main body 101 which are disposed to face each other. Each of the side surfaces 103 and 104 is provided with two lead terminals 105. The lead terminals 105 are disposed such that contact portions 107 thereof face the side surfaces 103 and 104. The insulating member 102 is formed to cover base ends 106 of the lead terminals 105.

As illustrated in FIG. 11B, the base ends 106 of the lead terminal 105 are covered with the insulating member 102 in the axial direction thereof and the contact portions 107 of the lead terminals 105 are disposed to protrude from the bottom surface of the insulating member 102. Protrusions 108 are formed to have a level difference at positions at which the insulating member 102 and the side surfaces 103 and 104 intersect each other. The protrusions 108 come in contact with the top end face of the wall portion at the time of assembly of the relay 100 into the housing member. The base ends 106 of the lead terminals 105 may be disposed to protrude from the protrusions 108 or may be disposed to protrude from the side surfaces 103 and 104 of the relay main body 101.

According to this configuration, the base ends 106 of the lead terminals 105 can be supported from the upper side by the insulating member 102. Accordingly, since a load applied to the lead terminals 105 at the time of insertion of the lead terminals 105 into the terminal fittings can be greatly reduced, it is possible to prevent deformation of the lead terminals 105. As a result, it is possible to keep the electrical connection state between the lead terminals 105 and the terminal fittings good and to prevent a decrease in the holding force of the relay 100 to the housing member. By covering the base ends 106 of the lead terminals 105 with the insulating member 102, it is possible to prevent short-circuit between neighboring lead terminals 105.

According to this configuration, since a stress (reaction force) acting on the lead terminals in bringing the lead terminals into contact with the terminal fittings is applied to the insulating member, it is possible to suppress deformation of the lead terminals. Accordingly, since the connection state between the lead terminals and the terminal fittings can be maintained good, it is possible to enhance reliability of the relay.

According to this configuration, since the insulating member is disposed to protrude from the component main body along the base ends of the lead terminals, the electronic component accommodated in the housing member can be simply detached from the housing member by hooking a rod-like tool to the insulating member and causing the tool to fall about a top end of an external wall of the housing member or the like.

According to this configuration, it is possible to prevent an electric shock due to contact of a finger with the lead terminals and to prevent a short circuit between the lead terminals due to contact of a conductor such as the tool with the neighboring lead terminals.

According to this configuration, since it is not necessary to newly provides a plate-like member as the insulating member, it is possible to prevent an increase in the number of components. It is also possible to suppress an increase in size of an electronic component or a module accompanying with an increase in thickness of the electronic component due to attachment of a plate-like member to an end surface of the component main body.

According to the present invention, it is possible to prevent deformation of a lead terminal.

While the embodiments of the present invention have been described in detail with reference to the drawings, the above-mentioned embodiments are only examples of the present invention and the present invention is not limited to the embodiments. Therefore, modifications in design or the like without departing from the gist of the present invention are included in the scope of the present invention.

For example, this embodiment describes an example in which the insulating member 26 formed independently of the relay main body 24 is attached along the end surface of the relay main body 24, but the insulating member may be formed integrally with the relay main body 24. In this case, the insulating member 26 is formed to protrude from the side surfaces of the relay main body 24. This embodiment describes that the insulating member 26 is formed over the entire end surface of the relay main body 24 along the end surface thereof, but the insulating member is not limited to this example as long as the insulating member is formed above the base ends 34 and 57 of the lead terminals 25 and 56 to face each other. In this case, for example, plural insulating members 26 formed in a plate shape are disposed to face the base ends 34 and 57 of the lead terminals 25 and 56.

For example, the embodiments have described the relay module using a relay as an electronic component, but the electronic component is not limited to the relay. The embodiments may be applied to other electronic components as long as they include a component main body and lead terminals having configurations and appearance similar to the relay main body and the lead terminals according to the embodiments. Specifically, the embodiments may be applied to, for example, a control module or a fuse in which components such as an electronic circuit board are accommodated in a resinous case.

What is claimed is:

1. An electronic component assembly structure comprising:
    an electronic component including a component main body having a rectangular parallelepiped shape, a plurality of lead terminals protruding from side surfaces of the component main body, and an insulating member;
    a housing member in which the component main body is inserted and accommodated by surrounding four side walls of the component main body with wall portions of the housing member; and
    a plurality of terminal fittings which are held in the housing member and to which the lead terminals are fitted, wherein:
        each of the lead terminals includes a base end protruding from at least one side surface of the component main body, and a contact portion connected to the base end to droop along the side surface,
        the insulating member is attached to the component main body, and the insulating member contacts or faces the base ends from a side of an end surface of the component main body which is most distant from a bottom wall of the housing member when assembling the electronic component into the housing member, and
        the component main body and the insulating member are inserted into and accommodated in the housing member, the plurality of lead terminals positioned at an outer side of the wall portions of the housing member come in contact with the plurality of terminal fittings, respectively, and the electronic component is assembled into the housing member.

2. The electronic component assembly structure according to claim 1, wherein
    the insulating member is formed in a substantially rectangular plate shape in a plan view and is disposed along the end surface of the component main body.

3. The electronic component assembly structure according to claim 1, wherein
    the insulating member partially or entirely covers the base ends in the protruding direction.

4. The electronic component assembly structure according to claim 2, wherein
    the insulating member partially or entirely covers the base ends in the protruding direction.

5. The electronic component assembly structure according to claim 1, wherein
    the insulating member is a part which seals accommodated elements included in the component main body.

6. The electronic component assembly structure according to claim 2, wherein
    the insulating member is a part which seals accommodated elements included in the component main body.

7. An electronic component comprising:
    a component main body having a rectangular parallelepiped shape;
    a plurality of lead terminals protruding from the component main body, and
    an insulating member, wherein:
        each of the lead terminals includes a base end protruding from at least one side surface of the component main body, and a contact portion connected to the base end to droop along the side surface, and
        the insulating member is attached to the component main body,
        when assembling the component main body into a housing member, the insulating member contacts or faces the base ends from a side of an end surface of the component main body which is most distant from a bottom wall of a housing member,
        the component main body and the insulating member are inserted into and accommodated in the housing member,
        four side walls of the component main body are surrounded by wall portions of the housing member, and
        the plurality of lead terminals are positioned at an outer side of the wall portions of the housing member.

8. The electronic component according to claim 7, wherein
    the insulating member is formed in a substantially rectangular plate shape in a plan view and comes in contact with the base end and is disposed along the end surface of the component main body.

9. The electronic component assembly structure according to claim 1, wherein the insulating member is spaced apart from the housing member in an extending direction of the base end of each of the lead terminals.

10. The electronic component according to claim 7, wherein the insulating member is spaced apart from the housing member in an extending direction of the base end of each of the lead terminals.

11. The electronic component assembly structure according to claim 1, wherein the component main body and the insulating member are completely inserted into and accommodated in the housing member.

12. The electronic component according to claim 7, wherein the component main body and the insulating member are completely inserted into and accommodated in the housing member.

13. The electronic component assembly structure according to claim 1, wherein the housing member is a resinous casing for accommodating and holding the electronic component and the terminal fittings, and includes a first housing chamber that guides and accommodates the component main body therein and a second housing chamber that accommodates and holds the terminal fittings therein.

14. The electronic component assembly structure according to claim 1, wherein the plurality of terminal fittings are inserted into the housing member in a first direction, and the lead terminals is fitted into the plurality of terminal fittings in a second direction parallel with the first direction.

15. The electronic component according to claim 7, wherein the plurality of lead terminals protrude from the component main body at opposite lateral ends of the component main body, and, when assembling the component main body into a housing member, the opposite lateral ends of the component main body and the insulating member are inserted into and accommodated in the housing member.

\* \* \* \* \*